(12) United States Patent
Lee et al.

(10) Patent No.: US 6,808,985 B1
(45) Date of Patent: Oct. 26, 2004

(54) PRODUCTS DERIVED FROM EMBEDDED FLASH/EEPROM PRODUCTS

(75) Inventors: Kuei-Ying Lee, Hsin-Chu (TW); Shao-Yu Chou, Chung-Li (TW); Jiun-Nan Chen, Hsin-Chu (TW); Yue-Der Chih, Hsin-Chu (TW); Sam Sheng-Deh Chu, Hsin-Chu (TW); Feng-Ming Kuo, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 227 days.

(21) Appl. No.: 10/082,021

(22) Filed: Feb. 21, 2002

(51) Int. Cl.[7] .............................................. H01L 21/00
(52) U.S. Cl. ...................................... 438/257; 438/278
(58) Field of Search .............................. 438/257–267, 438/275, 278

(56) References Cited

U.S. PATENT DOCUMENTS

| | | | |
|---|---|---|---|
| 5,488,006 A | * | 1/1996 | Shirota ....................... 438/258 |
| 5,751,040 A | | 5/1998 | Chen et al. ................. 257/332 |
| 5,938,774 A | | 8/1999 | Hsu ............................... 714/6 |
| 6,020,241 A | | 2/2000 | You et al. .................... 438/278 |
| 6,021,079 A | | 2/2000 | Worley ..................... 365/225.7 |
| 6,037,222 A | | 3/2000 | Huang et al. ............... 438/257 |
| 6,041,008 A | | 3/2000 | Marr ....................... 365/225.7 |

* cited by examiner

Primary Examiner—Richard A. Booth
(74) Attorney, Agent, or Firm—Thomas, Kayden, Horstemeyer & Risley

(57) ABSTRACT

A method of fabricating ROM products through the use of embedded flash/EEPROM prototypes is disclosed. This is accomplished by first forming a Flash/EEPROM prototype, performing programming simulations on the prototype, developing a ROM code and mask, and then forming a ROM product in the same manufacturing line by skipping certain Flash/EEPROM steps and then implanting the ROM code into the final ROM product. The method improves turn-around-time in the manufacturing line, and reduces cost to the customer. A method of doing business is also disclosed directed to providing ROM products to a customer without much redesign time and effort on the part of the customer.

31 Claims, 13 Drawing Sheets

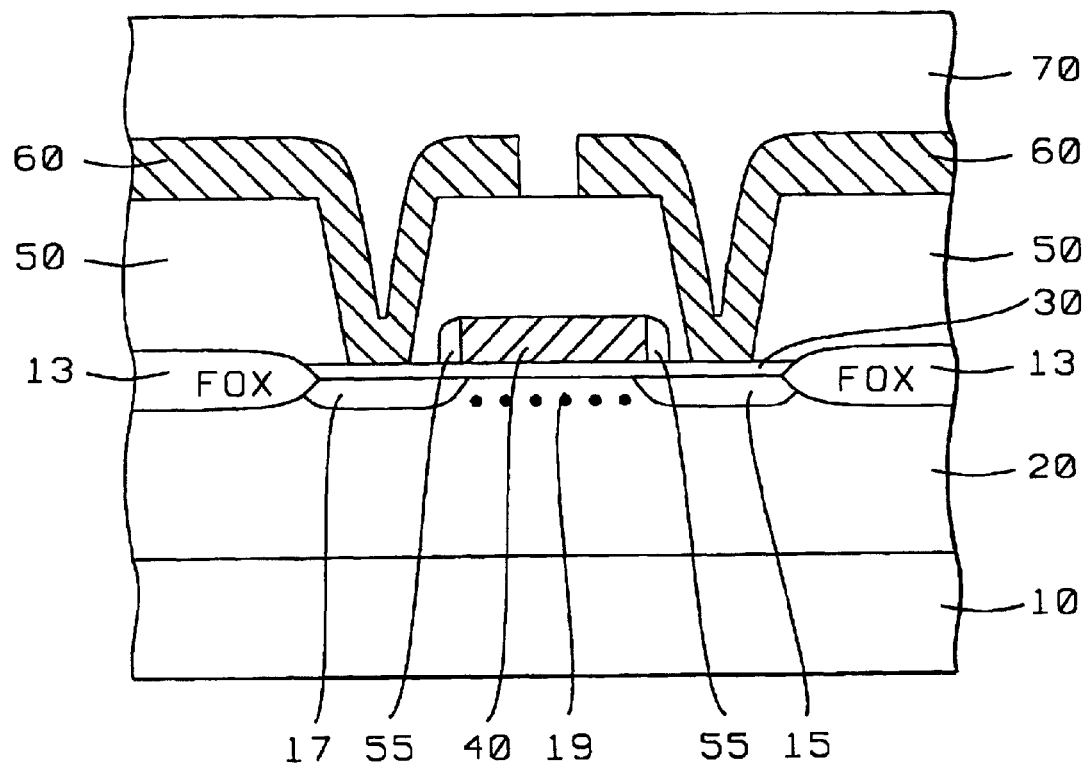
FIG. 1 - Prior Art

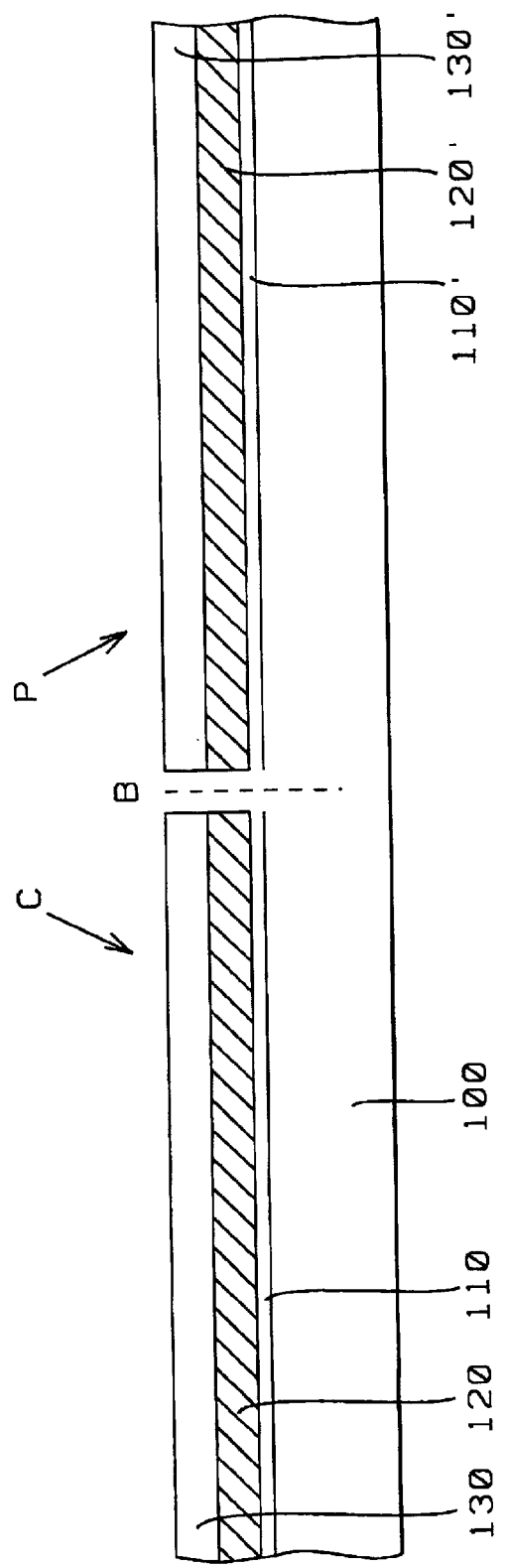
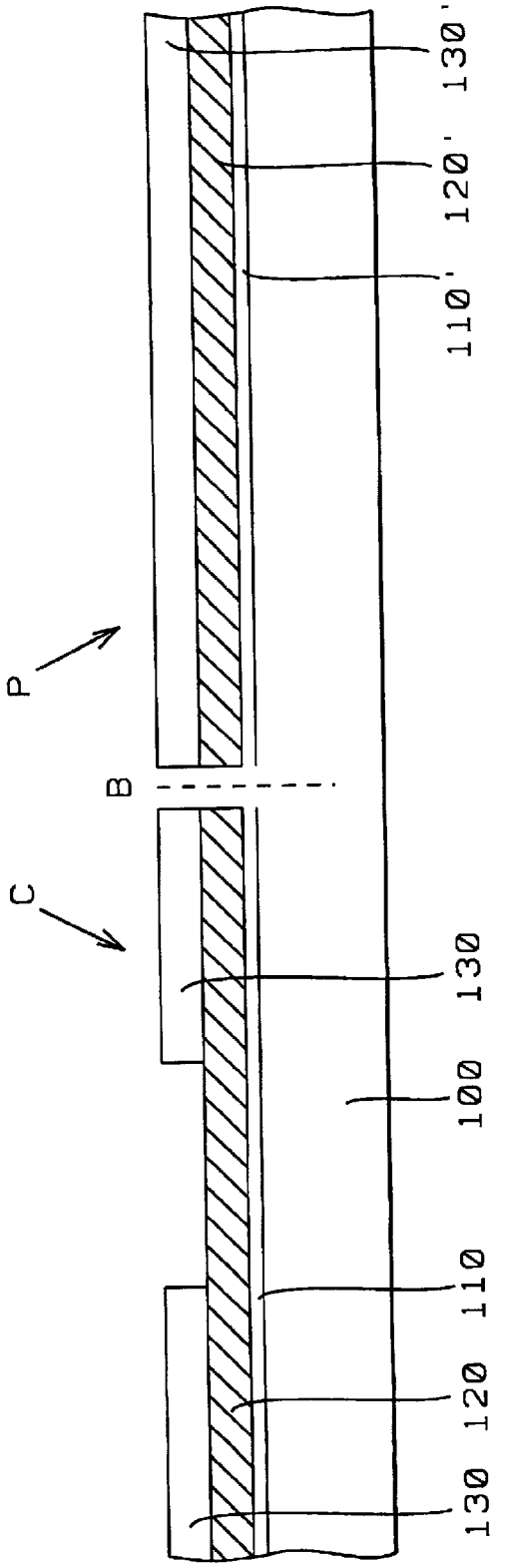
FIG. 2a
FIG. 2b

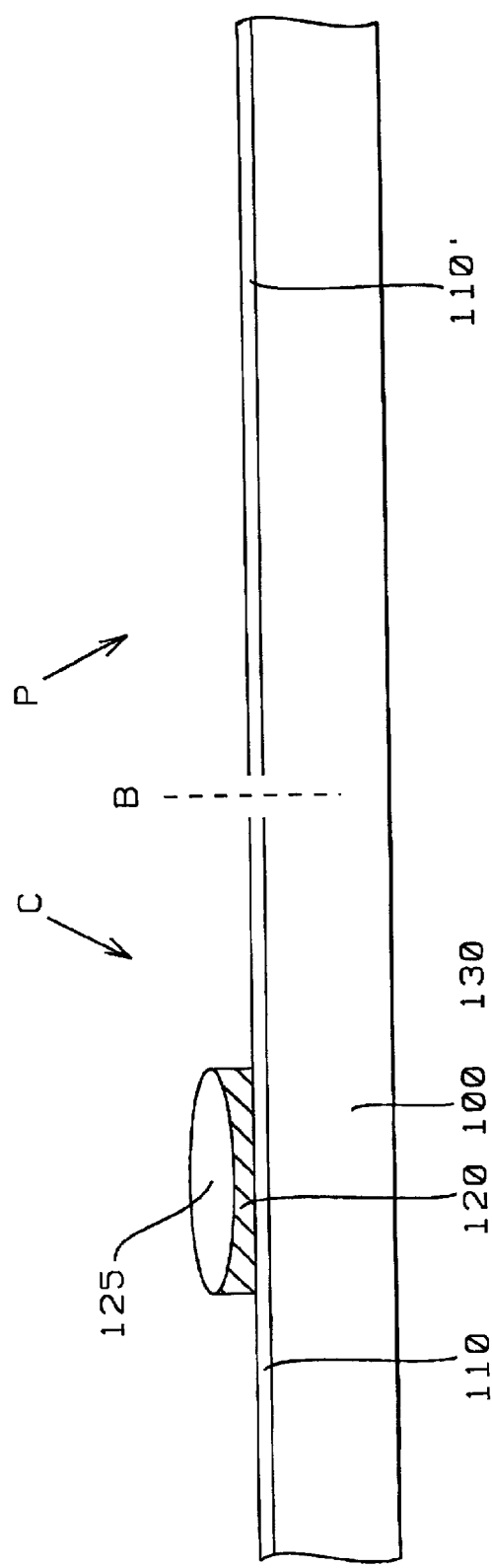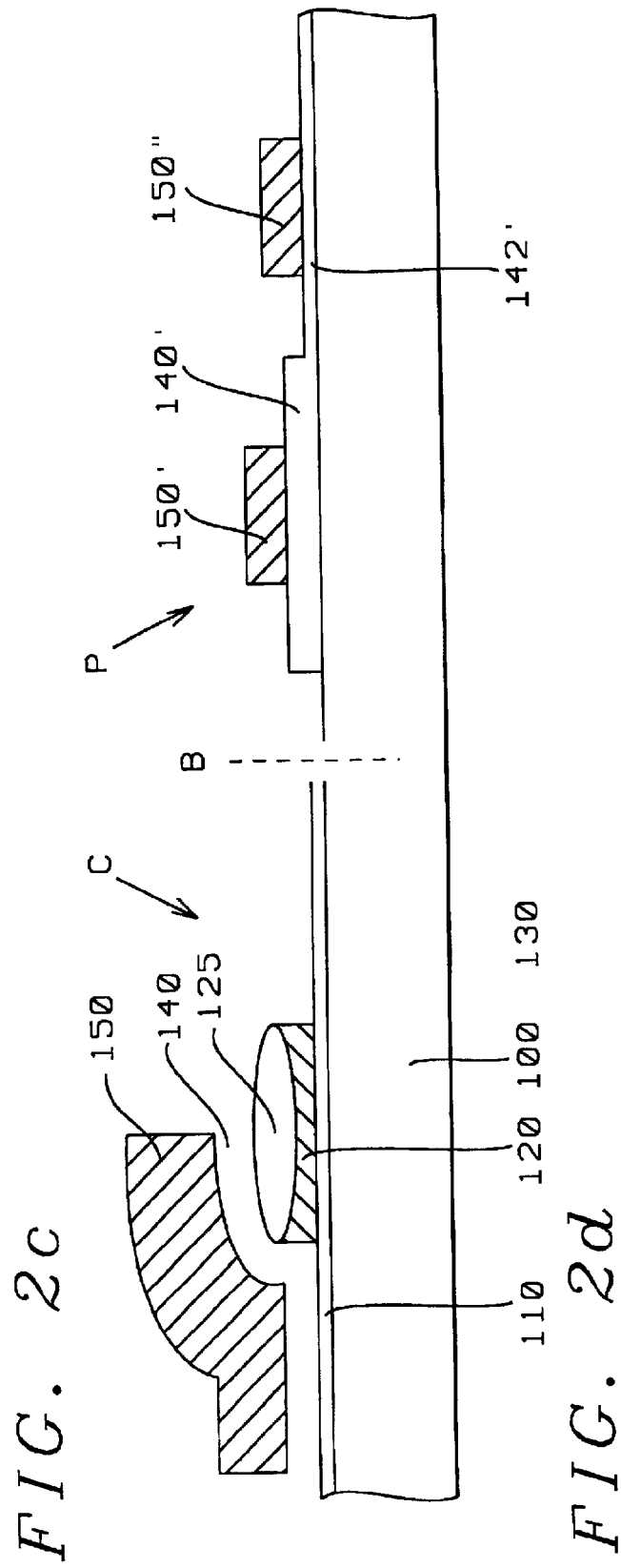

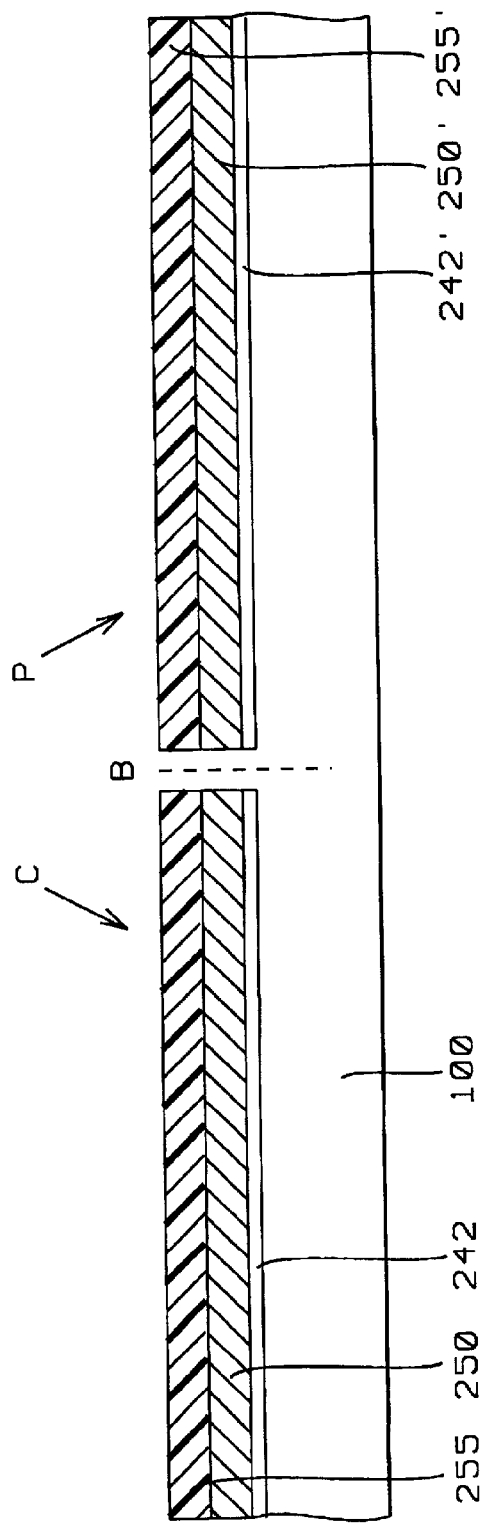
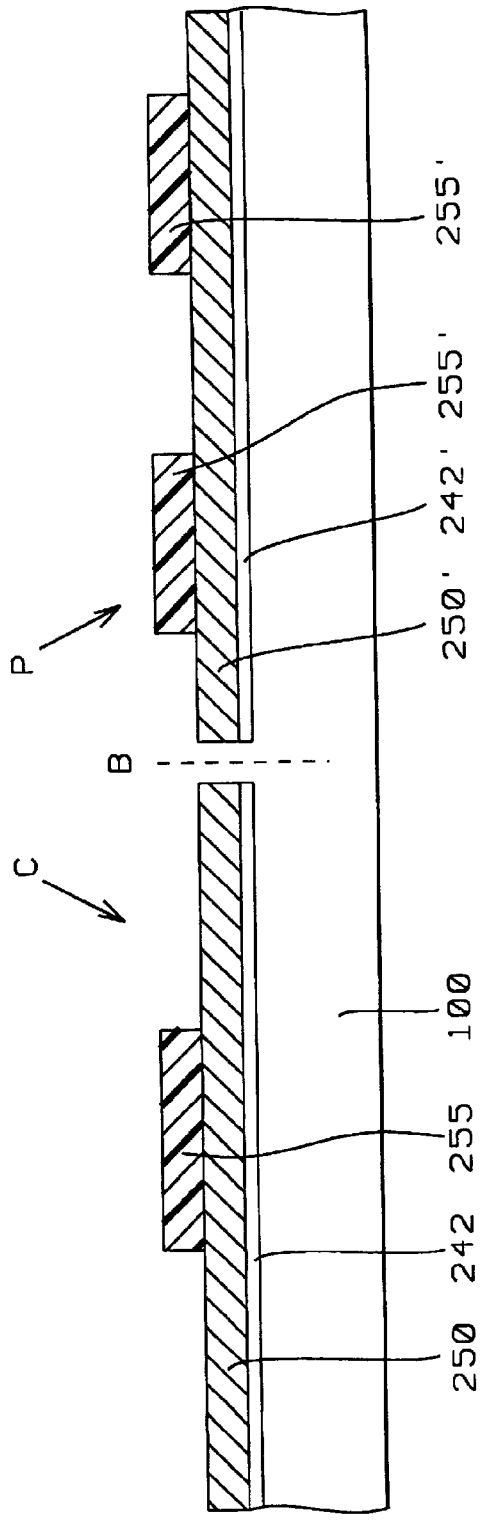
FIG. 3a
FIG. 3b

PRODUCTS DERIVED FROM EMBEDDED FLASH/EEPROM PRODUCTS

BACKGROUND OF THE INVENTION (1) Field of the Invention

The present invention relates to semiconductor manufacturing and is more particularly directed to expeditious conversion of embedded flash/EEPROM (electrically erasable programmable read only memory) products into other novel memory products.

(2) Description of the Related Art

In the manufacture of ROM products, it is usually the practice in the present manufacturing line to stock partially completed memory parts in a wafer bank and then finish them after having received a customer ordered ROM code, as will be explained more later. Then the completed wafer is assembled and tested before the product is shipped to the customer. Important factors in running a memory manufacturing line include turn-around-time (TAT), time to market and cost that are associated with the making of the product.

Digital memories allow for data storage (or writing) as well as data retrieval (or reading). Memories in which both of these functions can be rapidly and easily performed, and whose cells can be accessed in random order, are referred to as random-access memories (RAMs). Read-only memories (ROMs) are those in which only the read operation can be performed rapidly. As is known, entering data into a ROM, however, is referred to as programming the ROM, to emphasize that this operation is much slower than the writing operation used in RAMs.

In semiconductor RAMs, information is stored on each cell either through the charging of a capacitor or the setting of the state of a bistable flip-flop circuit. With either method, the information on the cell is destroyed if the power is interrupted. Such memories are therefore referred to as volatile memories. When charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (i.e., written into the memory) by setting the state of a flip-flop, it will be retained as long as power is connected to the cell (and no other write signals are received). As is known in the art, RAMs fabricated with such cells are called static RAMs, or SRAMS.

It is often desirable to use memory devices that will retain information even when the power is temporarily interrupted (or when the device is left without applied power for indefinite periods). Magnetic media offer such nonvolatile-memory storage In addition, a variety of semiconductor memories have been developed with this characteristic. At present, virtually all such nonvolatile memories are ROMs. While data can be entered into these memories, the programming procedure varies from one type of ROM to the other.

The first group of nonvolatile memories consists of those ROMs in which data is entered during manufacturing, and cannot subsequently be altered by the user. These devices are known as masked ROMs (or simply ROMs). The next category consists of memories whose data can be entered by the user (user-programmable ROMs). In the first example of this type, known as a programmable ROM, or PROM, data can be entered into the device only once.

In the remaining ROM types, data can be erased as well as entered. In one class of erasable ROMs, the cells must be exposed to a strong ultraviolet light in order for stored data to be erased. These ROMs are called erasable-programmable ROMs, or EPROMs. In the final type, data can be electrically erased as well as entered into the device; these are well-known as EEPROMs. The time needed to enter data into both EPROMs and EEPROMs is much longer than the time required for the write operation in a RAM.

The most cost effective, high volume production non-volatile memory used principally for program or instruction storage is the mask programmable Read Only Memory (ROM). The mask programmable ROM is dense, offers high access speed, and requires no special processing steps when used in standard MOS logic processes. However, while in development stages of the ROM code for these products, they often need to be re-programmed, which requires generation of a mask and the processing of at least a few wafers for code verification. The re-programming can be quite costly. Furthermore, the poor TAT can result in high chip development cost and costly "time to market" delays. Given the program complexity of today's micro-controllers and DSPs, repeated changes to program code or software is common.

One solution that has been found in prior art is the use of emulator chips. These chips remove the ROM and port the ROM addresses, control, and data I/O to chip pins for interface to an external Programmable Read Only Memory or PROM. Another method that may be used for code development is based on fuse or anti-fuse technology. Because of a reduced current requirement for programming the cell, anti-fuse technology has been preferred over fuse technology for MOS based memories. Anti-fuse technology uses an insulating element in the contact of an addressable cell which can be shorted by passing a relatively high voltage and current through the insulating element thereby causing a rupture or short and thus, a state change from an insulating element to a conductive element. Insulators include oxide ($SiO_2$), silicon nitride ($Si_3N_4$), various combinations of oxides and nitrides, polysilicon, and amorphous silicon. These types of memories are used in permanent applications requiring reliability and, therefore, need special high voltage transistors to program the cells. The addition of these special transistors to the process adds to its cost and are not required.

Worley, in U.S. Pat. No. 6,021,079 discloses an anti-fuse PROM which is embedded into a conventional CMOS process with some additional process steps and additional area for the wire circuitry. Nominal, low voltage transistors are used to program the PROM such that these transistors remain functional some time after programming for the purposes of verifying functionality of the memory's programming code. Once the program code has been verified a low cost production version of the part then can be made using standard ROM mask programming.

Another known programming method is called oxide programming which provides for two types of metal oxide semiconductor field effect transistors (MOSFET) by the use of different gate oxide layer thickness for each transistor type. Each oxide layer thickness corresponds to a different transistor threshold voltage. In programmed cells, the thickness of the gate oxide layer is about the same thickness as the field oxide, thereby providing a transistor which is permanently "off" or in a logic "0" state. Unprogrammed cells include typical thicknesses for the gate oxide layer so that the transistor is "on" or in logic "1" state. A disadvantage of the field oxide programming method includes a longer product TAT as measured from the programming step. Much of the process occurs after programming the gate oxide layers of the cells. Huang, et al., in U.S. Pat. No. 6,037,222 disclosed such a method for fabricating a dual-gate dielectric module for memory embedded logic using salicide technology and polycide technology.

On the other hand, You, et al., in U.S. Pat. No. 6,020,241 teach a threshold voltage implant method of manufacturing a ROM that is code implanted late in the process after the first level metal, thus reducing the TAT to ship a customer order. This method changes the transistor threshold voltage by ion implanting the transistor gates for programmed cells. In n-channel devices, impurities such as boron are implanted into exposed gates which raise their threshold voltage. The implant forces the gates of the cells permanently to an "off" state. Unexposed gates are not implanted and therefore provide cells at an "on" state. Heavy implants, however, often create damage to the thin gate oxide region. Damage to the gate oxide region causes higher parasitic junction capacitance between the source (or drain) and channel region of the metal oxide semiconductor field effect (MOS) transistor. Higher parasitic junction capacitance leads to an increase in average word-line capacitance, and often results in slower speeds.

It is often desirable to apply the ROM code onto the partially completed devices during a latter part of the manufacturing process. By applying the code at the later process, it takes less time to process the wafer from that point to completion. Less time for completion corresponds to a faster product turn-around-time. As the life cycle of integrated circuits become shorter, it is more desirable to fabricate products with shorter turn-around-times.

Industry relies on two general types of ROM array structures and combinations thereof using cells fabricated by the described methods. Such array structures include the serial ROM cell structure which is a NAND gate type structure and the parallel ROM cell structure known as the NOR gate type structure. Characteristics of NOR and NAND gate type structures are often competing.

A parallel NOR gate type structure includes a set of MOS transistors connected in parallel to the bit-line. The parallel structure typically increases the speed of the ROM but decreases bit or cell packing density. The lower density is caused by the use of a larger cell size. The larger cell size exists froth the contacts needed for each cell.

Alternatively, a serial NAND gate type structure often increases cell packing density or bit density but provides a slower operation speed. The serial structure forms a denser structure since no contact holes are required. Higher memory requirements for state-of-art devices use the denser serial NAND gate type structure.

FIG. 1 is a cross-sectional view of a programmed cell for a typical prior art ROM device fabricated by the threshold voltage implant method. The programmed cell may be used for a NAND gate type array structure. The threshold voltage implant method changes an enhancement mode n-channel metal oxide semiconductor field effect transistor (MOSFET) into a depletion mode device by implanting n-type ions into the channel region of the MOS transistor. The n-type implant programs or codes the transistor of the cell. In the present invention, however, p-type code is used for an enhancement mode n-channel MOS for the ROM process that is disclosed later in the embodiments of the invention.

The programmed cell shown in FIG. 1 includes a depletion mode MOS transistor in a semiconductor substrate (10). The programmed cell defines a p-type well region (20), field oxide regions (13), gate oxide region (30), and source/drain regions (15), (17). The programmed cell also defines an implanted channel region (19) under the gate oxide region (30). The implanted channel region changes the enhancement mode MOS transistor into the depletion mode transistor. A polysilicon gate (40), gate sidewall spacers (55), borophosphosilicate glass layer (50) (BPSG), metallization layer (60), and surface passivation (70) are also shown. The polysilicon gate, source region, drain region, and channel region define the depletion mode MOSFET.

Each cell, such as the cell of FIG. 1, corresponds to a region for storing bits of information in a ROM semiconductor integrated circuit chip. Thousands and even millions of these microscopically small regions make up a core memory area (or active cell area) of the ROM chip. The completed ROM chip also includes peripheral circuits, interconnects, and bonding pad.

A ROM embedded SRAM utilizing an existing support circuitry of the SRAM array is disclosed by Marr in U.S. Pat. No. 6,041,008. By disabling or not disabling SRAM cells by removing or not removing the ground or power connections to each cell in different combinations, a pair of SRAM cells are used to permanently store a specified logic state, i.e., functions as a ROM cell. A self-aligned source/drain mask ROM memory cell using trench etched channel is shown in U.S. Pat. No. 5,751,040 by Chen, et al. And an apparatus for repairing faulty program segments in embedded microprocessor systems is disclosed by Hsu in U.S. Pat. No. 5,938,774.

What is also needed in the art is a method for the customers not to re-design their ROM parts so that they can switch their Flash/EEPROM products to ROM parts easily and with the same layout. Such a method is disclosed later in the embodiments of the present invention.

SUMMARY OF THE INVENTION

It is therefore an object of the present invention to provide a method of using embedded flash/EEPROM as a prototype and use the same database to form embedded ROM products in order to improve turn-around-time in the manufacturing line, time-to-market, and reduce cost for the customer.

It is another object of the present invention to provide a method for making this switching process from embedded flash/EEPROM to embedded ROM possible without any re-design effort on the part of the customer.

It is still another object of the present invention to provide a method of removing certain masking steps and switching the manufacturing process from embedded flash/EEPROM to pure logic or mixed mode process with a ROM code.

It is yet another object of the present invention to provide a method of combining the manufacture of embedded flash/EEPROM and embedded ROM products into the same manufacturing line by a judicious skipping of certain process steps and modifying a few masks in the former, and implanting a ROM code into the latter.

It is also yet another object of the present invention to provide a method of doing business directed to the manufacture of embedded ROM products with simple design changes and without much time and effort on the part of the customer.

These objects are accomplished by the converting of an embedded Flash/or EEPROM process to a logic process with the same design. Different Flash/EEPROM cell structures, including split-gate flash and stacked gate flash, can have the same approach. With split-gate flash as an example, these objects are accomplished by providing an embedded flash/EEPROM prototype substrate having different well regions; defining a cell region and a periphery region further comprising a low-voltage LV-region, and a high-voltage HV-region in said substrate; forming a gate oxide layer on said substrate including over said cell region and said periphery region; depositing a first polysilicon layer over said gate oxide layer on said substrate; forming a nitride layer over said first polysilicon layer; patterning said nitride layer to form openings to expose portions of said polysilicon layer; oxidizing said portions of said first polysilicon layer to form poly-oxide as caps over said polysilicon layer; removing said nitride layer to expose other portions of said first polysilicon layer not protected by said caps; removing said other portions of said first polysilicon layer by using said poly-oxide as a hard-mask to form floating gate underlying said cap; forming a first thick interpoly oxide over said substrate, including over said cell region and over said periphery region; removing said first thick interpoly oxide (IPO) over said periphery LV-region using one photo-mask; forming a second interpoly low-voltage LV-oxide over said cell region and over said periphery region; forming a second polysilicon layer over said LV-oxide and said thick interpoly oxide over said substrate, including said cell region and said periphery region; patterning said second polysilicon layer to form a control gate over said cell region and a poly gate over said periphery region; performing a lightly doped drain (LDD) implant over said substrate; forming oxide/SiN spacers along every exposed polysilicon edge, including sides of said floating gate, control gate and gate poly; performing source/drain implant; forming an interlevel dielectric layer (ILD) over said substrate; planarizing said ILD layer using either etch-back or CMP methods; forming a contact hole in said ILD layer; forming metal in said contact hole and continuing to finish said embedded flash/EEPROM memory prototype; performing programming simulation for a ROM product using said embedded flash/EEPROM prototype; generating data to form ROM code for said ROM, product; providing a ROM product substrate having a cell region and a periphery region; forming a ROM gate oxide, comprising LV-gate oxide, over said ROM product substrate, including said cell region and said periphery region; forming a gate polysilicon layer over said ROM gate oxide layer; patterning said gate polysilicon layer to form a polysilicon gate; performing an LDD implant over said ROM substrate; forming oxide/SiN spacers along sides of said polysilicon gate; performing source/drain implant over said ROM substrate; forming a ROM mask; performing ROM code implant, using said ROM code; forming an ILD layer over said substrate; forming a contact hole in said ILD layer; and forming metal in said contact hole to and continuing to complete the said flash ROM product.

The method of doing business objects are accomplished by providing a first manufacturing process for an embedded Flash or embedded EEPROM product; manufacturing said embedded Flash or embedded EEPROM product by said first manufacturing process for customer's prototyping activities with more flexibility that customers can shorten time to market; providing a second manufacturing process for an embedded ROM product that is similar to the first manufacturing process; manufacturing said embedded ROM product by said second manufacturing process, whereby said customer has to do minimal re-design in converting a design of said embedded Flash or embedded EEPROM product to a design of said embedded ROM product.

BRIEF DESCRIPTION OF THE DRAWINGS

In the accompanying drawings, similar numerals refer to similar parts throughout the several views.

FIG. 1 is a partial cross-sectional view of a semiconductor substrate showing the forming of a conventional ROM device.

FIG. 2a is a partial cross-sectional view of a semiconductor substrate at a common boundary between a memory cell region and a peripheral logic device region (periphery region) showing the forming of a floating gate oxide layer, a first polysilicon layer, followed by a nitride layer, according to this invention.

FIG. 2b is a partial cross-sectional view of a semiconductor substrate at a common boundary between a memory cell region and a peripheral logic device region showing the patterning of the nitride layer of FIG. 2a, according to this invention.

FIG. 2c is a partial cross-sectional view of a semiconductor substrate at a common boundary between a memory cell region and a peripheral logic device region showing the forming of a floating gate and the poly-oxide cap, according to this invention.

FIG. 2d is a partial cross-sectional view of a semiconductor substrate at a common boundary between a memory cell region and a peripheral logic device region showing the forming of a flash memory cell in the cell region and of LV and HV devices in the periphery region, according to this invention.

FIG. 3a is a partial cross-sectional view of a ROM semiconductor substrate at a common boundary between a memory cell region and a peripheral logic device region (periphery region) showing the forming of a gate oxide layer, a first polysilicon layer, followed by photo-resist definition, according to this invention.

FIG. 3b is a partial cross-sectional view of a ROM semiconductor substrate at a common boundary between a memory cell region and a peripheral logic device region showing the patterning of the photo-resist of FIG. 3a, according to this invention.

DESCRIPTION OF THE PREFERRED EMBODIMENTS

It is shown in these embodiments of the present invention a process for quickly and efficiently converting embedded flash or EEPROM designs into embedded ROM parts. This involves the modification of only a few masks through simple logic operation at mask tooling in the manufacturing line.

Figure 5A:
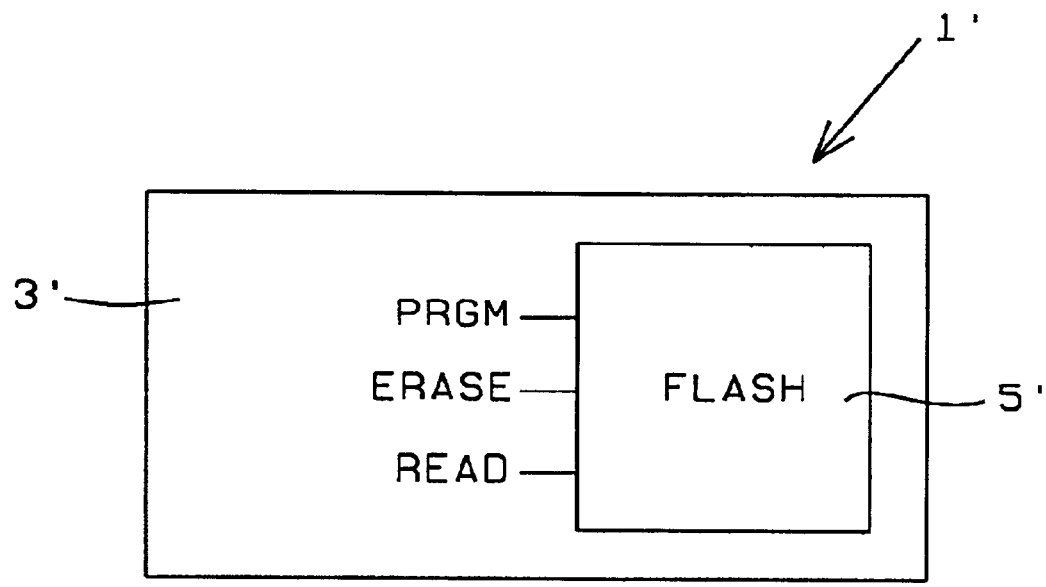
FIG. 5a shows an external or an embedded Flash/EEPROM product as manufactured in the present manufacturing line.
Figure 5B:
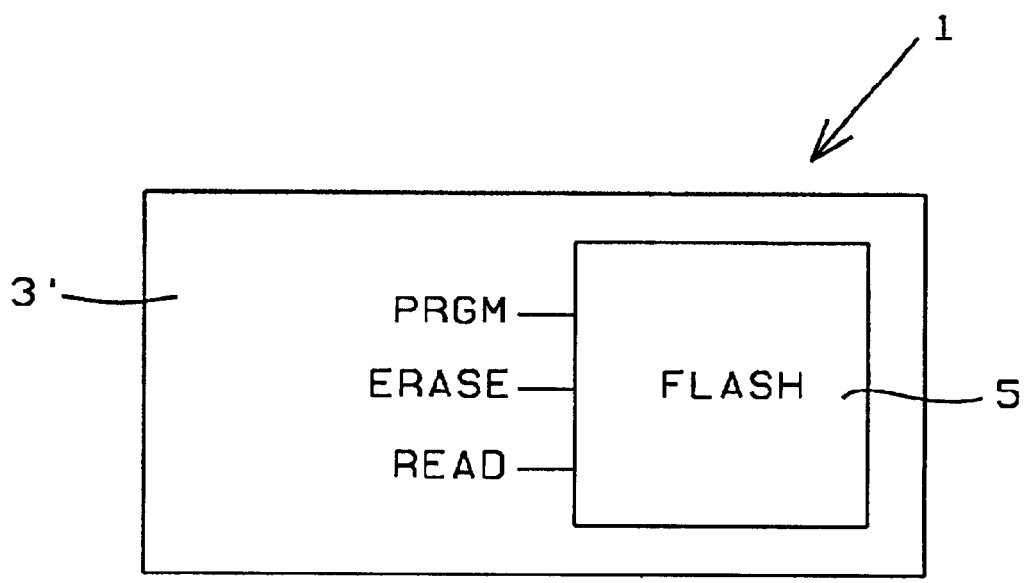
FIG. 5b shows an embedded ROM product manufactured by the use of the Flash/EEPROM product of FIG. 5a by the customer for prototyping to develop a software program, which in turn used to code the ROM product, according to the present invention.
Figure 5C:
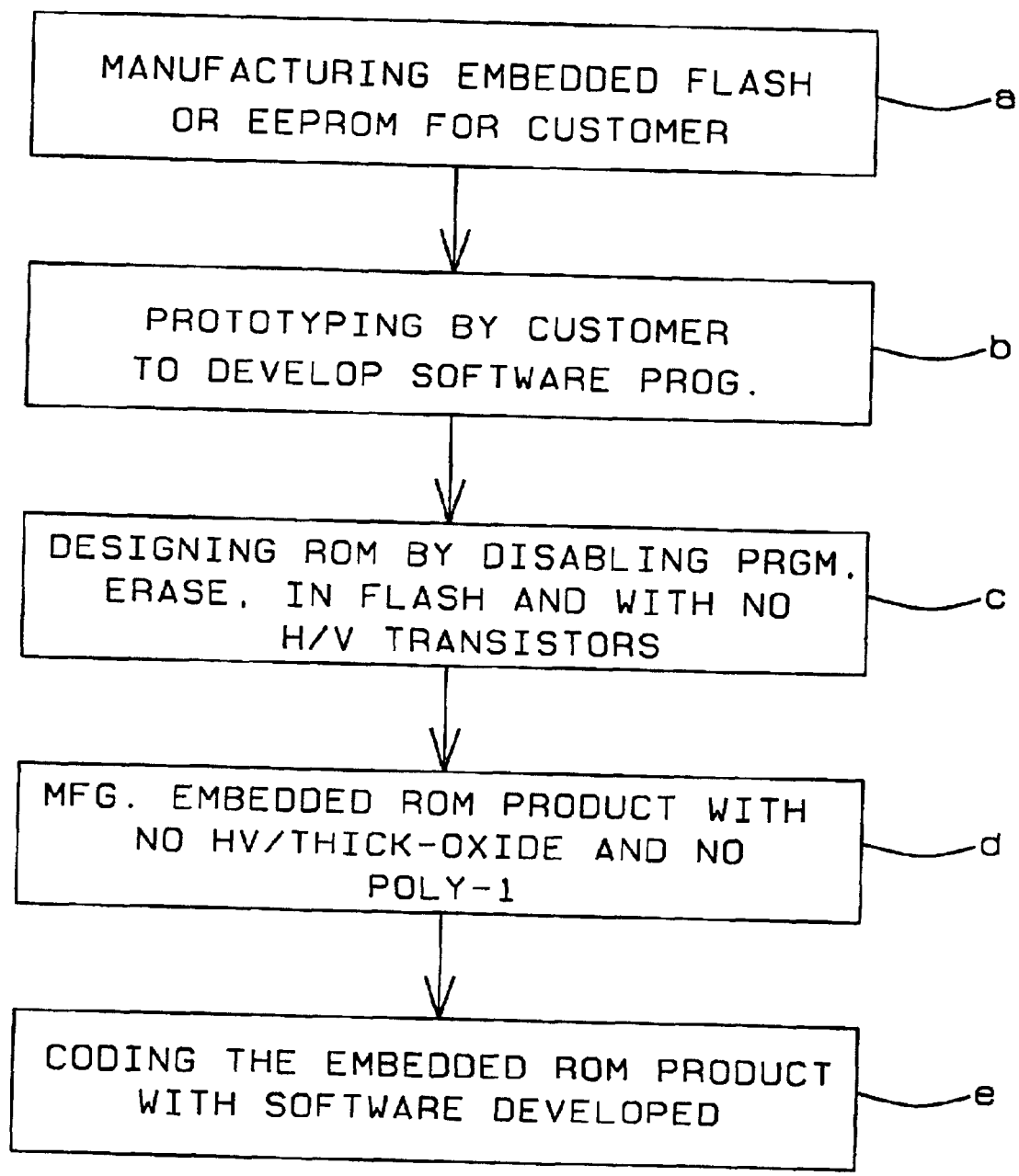
FIG. 5c is a Flow Chart showing the method of doing business in converting an embedded Flash/EEPROM product into an embedded ROM product with minimal redesign effort on the part of the customer.

Referring now to the drawings, FIGS. 2a–2f show first the forming of an embedded flash or an EEPROM memory prototype, and then FIGS. 3a–3f show the forming of a ROM product. FIGS. 5a–5c show a method of doing business directed to providing ROM products to a customer in the most efficient and cost effective manner.

It is a main feature and key aspect of the present invention that the embedded flash/EEPROM prototype and the final ROM product are fabricated in the same manufacturing line, contrary to the normal practice in the industry. The cost savings are therefore substantial. It will also be appreciated by those skilled in the art that, because the manufacturing of a ROM part can be implemented simply by switching from the embedded flash/EEPROM process shown in FIG. 4a of the drawings to the ROM steps of FIG. 4b, in the same manufacturing line, the turn-around-time (TAT) can be significantly improved, and the cost to the customer can, likewise, be reduced.

The switch involves the elimination of some process steps, while at the same time modifying some of the flash/EEPROM masks. The number of masks that are to be modified depends upon the particular technology that is being used. Thus, while 3 mask layers are modified for the 0.5 micron technology, 3 layers are modified for 0.35 micron technology and 5 mask layers for the 0.25 micron technology. The modification—accomplished with a simple logic operation—is necessitated by the different process bias levels that are used in flash/EEPROM and ROM cells, and also for switching high-voltage (HV) cells to normal cells, as it will be known to those skilled in the art. In the flash/EEPROM, the cell is in a P-substrate, while the periphery low-voltage (LV)-MOS is on a N-well/P-well, and the periphery HV-MOS on a HV N-well/P-substrate. In ROM, the cell is on a P-well, periphery LV-MOS on N-well/P-well, and the periphery HV-MOS is changed to be on N-well/P-well.

In FIGS. 2a–2f and 3a–3f, cross-sectional view of a partially completed semiconductor substrate is shown having a common boundary (B) which separates a memory cell region (C) from a peripheral logic device region (P). Though the method is disclosed in conjunction with memory circuits where both P doped and N doped wells are provided for making N- and P-channel FETs, it should be understood that the method equally applies to other semiconductor integrated circuits, including CMOS. In order to differentiate more readily those portions of the material that are formed over the respective regions, reference numerals referring to the same material parts on the peripheral region are primed while those that are on the cell region are not.

It is preferred that substrate (100) comprises P+ type single-crystal silicon having a <100> crystallographic orientation. Peripheral region (P) includes both N-well and P-well, while cell (C) region is located in P-substrate. A thick field oxide, FOX, (not shown) is formed around both the memory and logic device regions to provide electrical isolation between them. The most commonly used field oxide is formed by the method of Local Oxidation of Silicon (LOCOS) in which silicon nitride ($Si_3N_4$) layer (not shown) is deposited and patterned leaving portions over device regions. Another commonly used method is the shallow-trench-isolation (STI). The substrate is then subjected to thermal oxidation to oxidize the exposed surface of the silicon substrate to form field oxide.

After the forming of the two wells, or tubs as they are sometimes known, and of the active and passive field oxide regions, a gate oxide layer (110), or floating gate oxide, is formed over the device regions (both logic and memory device regions) of FIG. 2a by thermal oxidation. Floating gate oxide (110), which provides hot electron transfer from the substrate into the floating gate, is preferably grown thermally in dry oxygen in an oxidation furnace at temperature range between about 800 to 1000° C., and to a thickness between about 80 to 120 Å. Alternatively, other oxidation methods can be used, such as oxidation in a dry oxygen and anhydrous hydrogen chloride in atmospheric or low pressure environment, or low temperature, high-pressure, and the like.

A first polysilicon layer (120) is next deposited over gate oxide layer (110) and elsewhere on the field oxide regions, as shown in FIG. 2a. The polysilicon layer is preferably deposited by LPCVD using, for example, silane ($SiH_4$) as the reactant gas, and is deposited in a temperature range of between about 550 to 650° C. The preferred thickness of the first polysilicon layer is between about 1000 to 2000 Å.

Using conventional techniques, nitride layer (130) is then formed over first polysilicon layer (120) and patterned leaving portions of the nitride layer over the memory device region (C) while protecting the polysilicon layer (120') over the peripheral logic region (P). The patterning over the cell region corresponds to the floating gate that is to be formed at the next step. As is known in the art, the nitride layer can be deposited by LPCVD using, for example, dichlorosilane ($SiCl_2H_2$) and ammonia ($NH_3$), and etched back at low pressure in a reactive ion etcher (RIE) or in a high-density plasma (HDP) etcher using a gas mixture such as carbon tetrachloride ($CF_4$) and hydrogen ($H_2$). It is preferred that the nitride layer has a thickness between about 800 to 2000 Å. The patterning of the nitride layer is accomplished in an high-density plasma (HDP) nitride etcher with etch recipe comprising gases $O_2$, $CF_4$ and He, or using $CF_4$—$O_2$ plasmas.

After the patterning of the nitride layer, portions of first polysilicon layer (120) exposed therethrough the pattern as shown in FIG. 2b is wet-oxidized to form poly-oxide cap (125) shown in FIG. 2c. The preferred thickness of the poly-oxide layer is between about 1000 to 2500 Å. Subsequently, the nitride layer is removed from the substrate. Next, using the poly-oxide cap thusly formed as a hard-mask, the first polysilicon layer is etched until gate oxide layer (110) in the cell region, and (110') in the peripheral, or periphery, region are reached as shown in FIG. 2c. Polysilicon layer (120) underlying the poly-oxide cap layer (125) is to serve as a floating gate of the flash memory cell, as shown in the same FIG. 2c. The etching is performed using anisotropic plasma etching, for example in a reactive ion etcher (RIE), and using an etchant gas such as $CL_2$ and HBr and a carrier gas, such as argon (Ar). This results in selective etching of the polysilicon layer (120') to the gate oxide (110').

Referring now to FIG. 2d, after the forming of floating gate (120), a layered inter-poly oxide (IPO), composite layer (140) in the same figure, is formed over the substrate as an insulating layer between the floating gate and control gate (150) to be formed at a later step over the cell region (C). Composite IPO layer (140) is layered, because through masking techniques, first, a relatively thick first IPO layer is formed over the cell region and over the peripheral HV MOS, or periphery, region; then a second IPO layer is formed over the cell region and all the periphery region. This will be better understood by noting in the periphery region of FIG. 2d, there are low-voltage (LV) and high-voltage (HV) MOS devices to be formed, and HV devices require thicker gate oxide in order to prevent oxide damage due to higher voltage. Hence, HV device (150') is formed over composite IPO layer (140') and LV device (150") is formed over the thinner gate oxide (142'), while composite IPO (140) in the cell region encompasses all two IPOs. It is preferred that the IPOs comprise oxide-nitride-oxide (ONO) and the first thicker IPO has a thickness between about 150 to 300 Å, and en the second IPO has a thickness between about 30 to 150 Å.

The forming of the various IPOs is followed by the forming of a second polysilicon layer over the IPOs, which till is then patterned to form control gate (150) in the cell region, and HV gate poly (150') and LV poly gate (150") in the periphery region as shown in FIG. 2d. The conformal second polysilicon layer is formed by using LPCVD similar to the deposition for the first polysilicon layer, and then silicided using conventional techniques to form a polycide. For the 0.5 and 0.25 micron technologies, the salicidation is accomplished by chemical vapor deposition (CVD) of tungsten silicide ($WSi_x$) and photolithographic etching over the control gate. For the 0.25-micron technology, $TiSi_x$ is used. The preferred thickness of the polycide layer is between about 2000 to 3000 Å. After having formed the polycide control gate, the substrate is subjected to a lightly doped drain (LDD) implant, again, using well known techniques.

At the next step, oxide/silicon nitride (SiN) spacers, which are well known in the art, are formed along every exposed polysilicon edge, including the floating gate, control gate and the gate poly. Oxide/SiN spacers (145) in the cell region, and those that are in the periphery region, namely, (145') are better seen in FIGS. 2e, and 2f, which show the respective regions. The preferred thickness of the spacers is between about 800 to 2000 Å. Using the self-aligned spacers, source and drain regions (103), (105) and (103'), (105') are formed by implanting with arsenic(A)/phosphorus (P) ions for N-MOS devices, or with boron (B)/boron fluoride ($BF_2$) ions for P-MOS devices, at a dosage level between about $1\times10^{15}$ to $5\times10^{15}$ atoms/cm$^2$ and energy level between about 20 to 50 KeV.

Substrate (100) is next deposited with an interlevel dielectric (ILD) layer (160). Blanket dielectric layers may be formed from materials including but not limited to undoped/doped silicon oxide materials, silicon nitride materials, and silicon oxynitrides materials formed within integrated circuits through methods including but not limited do CVD, PECVD methods. For the preferred embodiment of the present invention, the blanket dielectric layer (200) is preferably formed of a dielectric material chosen from the group of dielectric materials consisting of silicon oxide dielectric materials, silicon nitride, and silicon oxynitride and has a thickness between about 7000 to 14000 Å, after planarization by well-known etch-back or chemical mechanical polishing (CMP) techniques.

Figure 2E:
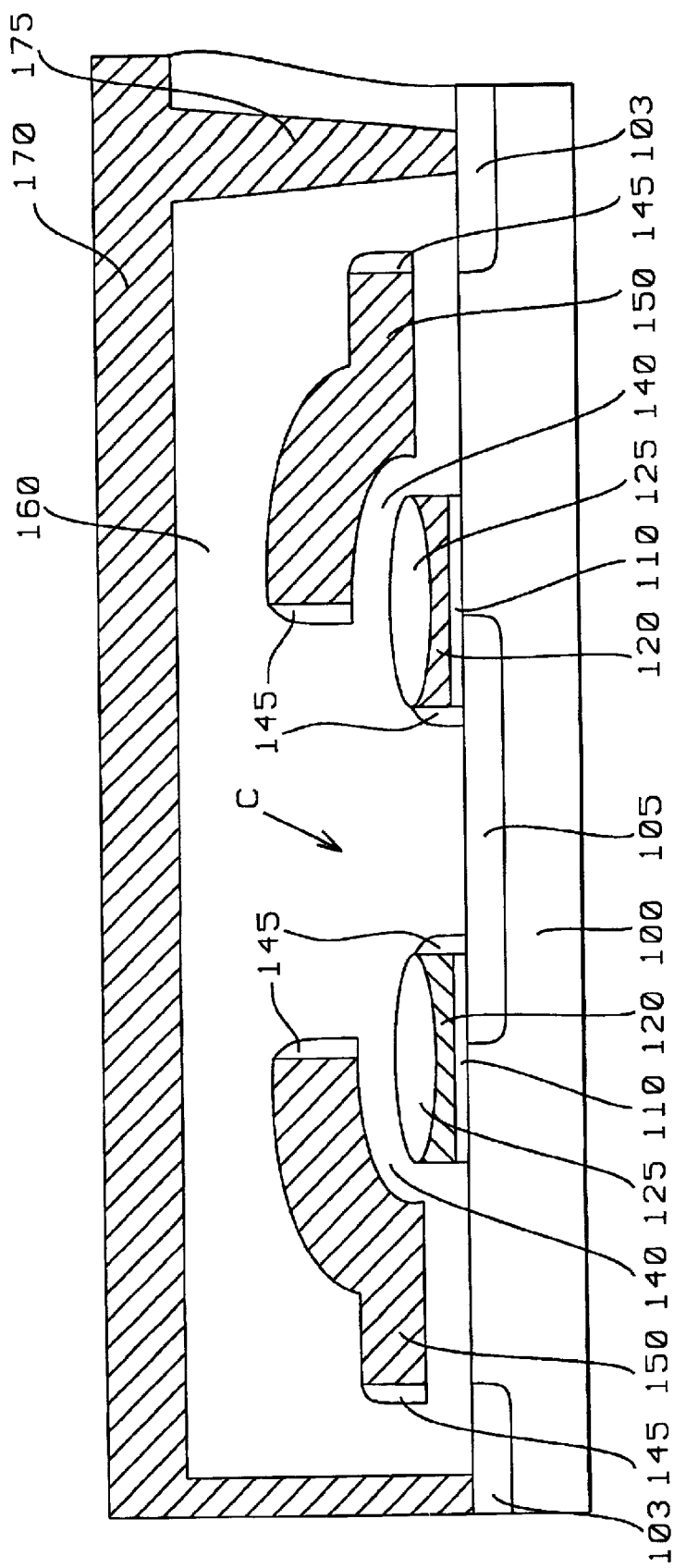
FIG. 2e is a partial cross-sectional view of a semiconductor substrate showing the completion of the cell region of the embedded flash/EEPROM prototype of the present invention.
Figure 2F:
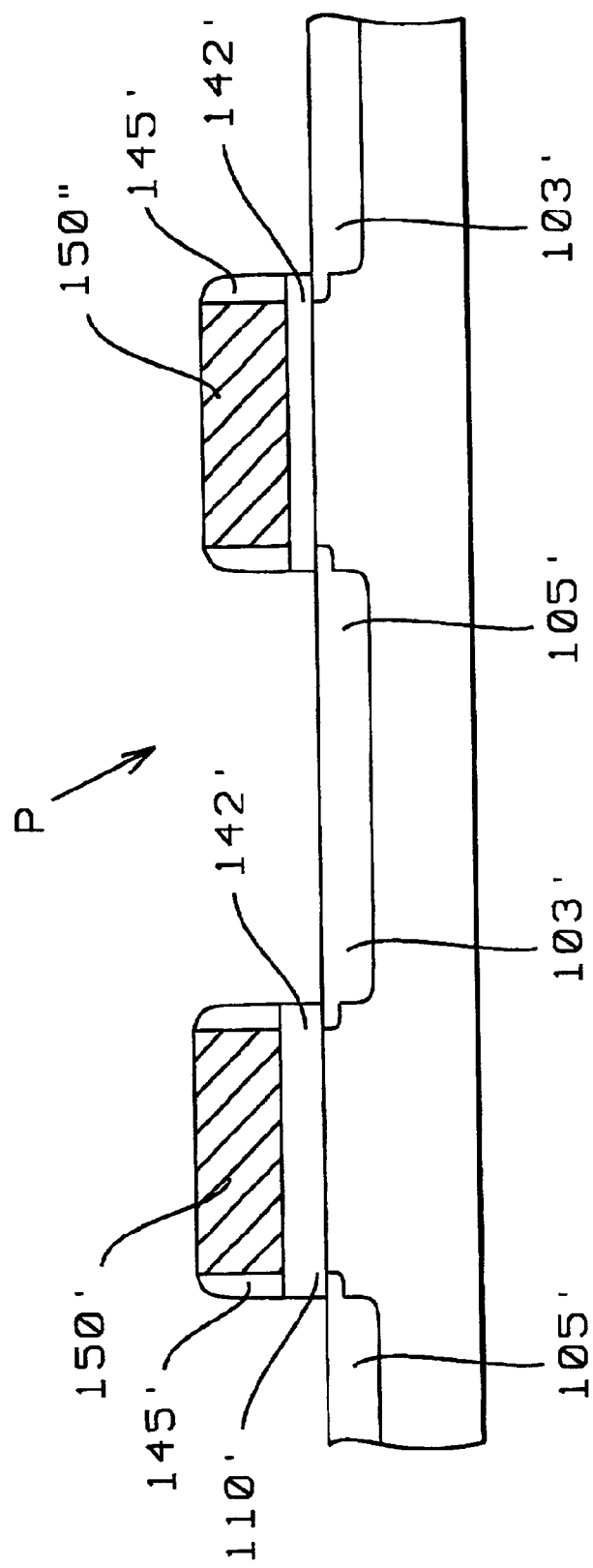
FIG. 2f is a partial cross-sectional view of a semiconductor substrate showing the completion of the periphery region of the embedded flash/EEPROM prototype of the present invention.

Dielectric layer (160) is next etched to form contact holes both in the cell region (C) and the peripheral region (P). The substrate is then metallized by depositing metal (170) as shown in FIG. 2e. The metal may be aluminum or copper, and the preferred thickness is between about 4000 to 6000 Å.

Figure 4A:
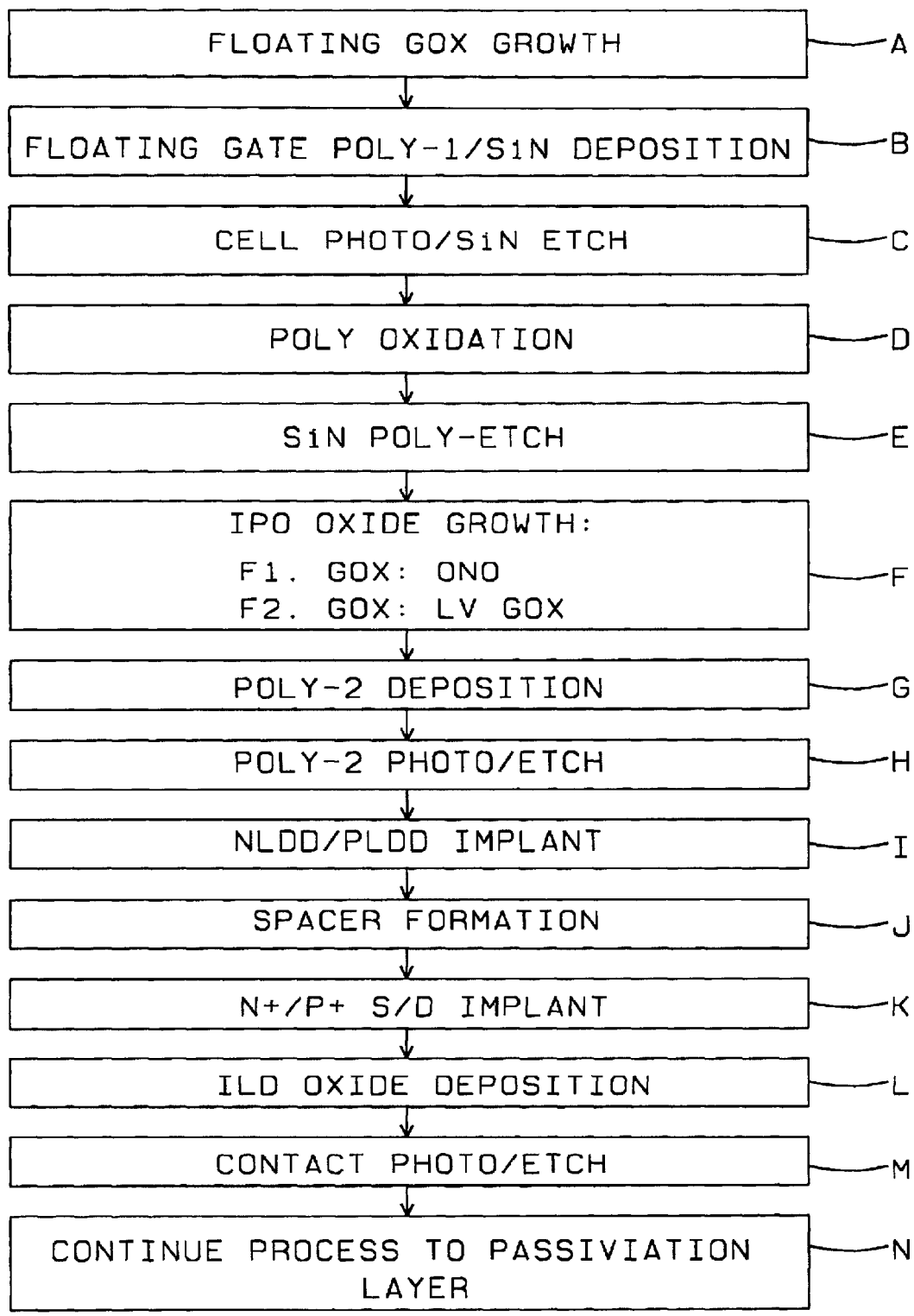
FIGS. 4a and 4b, respectively, show a summary of the process steps of forming the embedded flash/or EEPROM prototype and the ROM product of this invention.

The above steps of forming the embedded flash/EEPROM of the present invention are summarized in FIG. 4a as Steps A through M. The "Gox" in Step A refers to gate oxide, while Poly-1 and Poly-2 refer to the first and second polysilicon layers. The nitride layer is shown as silicon nitride in FIG. 4a. It is a main feature and key aspect of the present invention that because the disclosed embedded flash/EEPROM products have program/erase function, a customer can use the embedded flash EEPROM product as a prototype, and easily modify their code until it is finalized. Once their code is finalized, the same products can be used as a prototype for ROM products so that one can switch from the flash/EEPROM process shown in FIG. 4a to the ROM process shown in FIG. 4b. That is, once the ROM code is determined by use of the programmable/erasable embedded flash/EEPROM prototype, the ROM product can be fabricated in the same manufacturing line by switching from the steps shown in FIG. 4a to the steps shown in FIG. 4b.

Thus, a ROM semiconductor substrate (100) is provided as shown in FIG. 3a. Then the 5 process steps, namely, Steps A through E are skipped as shown in FIG. 4b. A ROM gate oxide, layer (242), is formed over the substrate, including both the cell region, C, and the periphery region, P. ROM Gate oxide is of uniform thickness, preferably, between about 30 to 150 Å, which is needed for the LV devices only, since the high voltage circuits and the original program/erase functions of the embedded flash/EEPROM memory block are now disabled. Hence, Step F1 of FIG. 4a is also skipped. So far, therefore, six steps used in the embedded/flash EEPROM prototype are skipped, shortening the build time, that is, the turn-around-time (TAT).

Figure 3C:
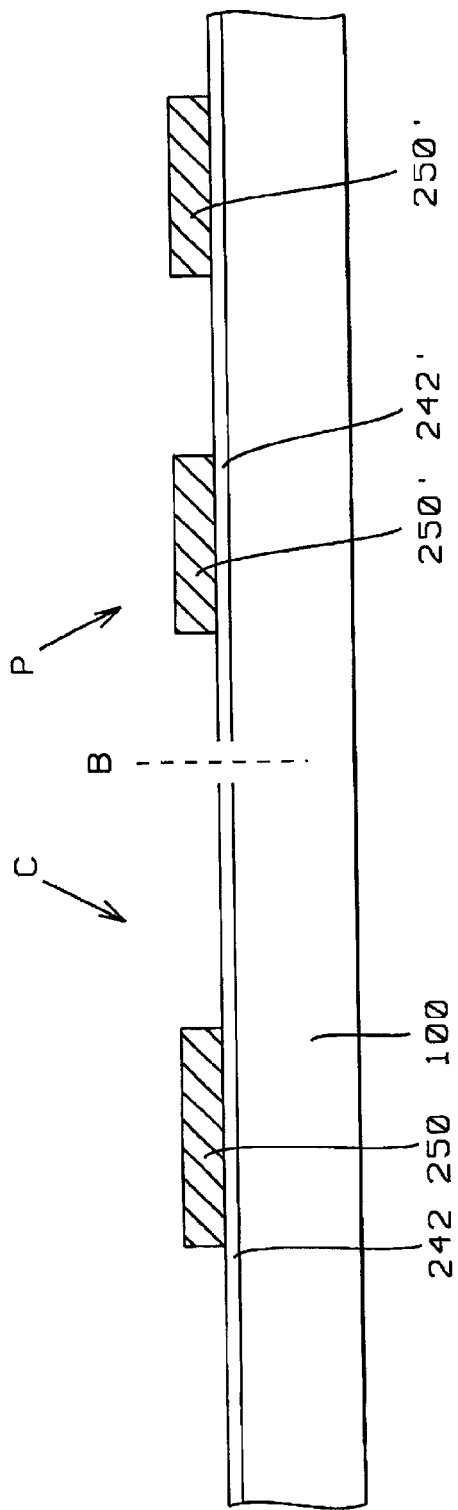
FIG. 3c is a partial cross-sectional view of a ROM semiconductor substrate at a common boundary between a memory cell region and a peripheral logic device region showing the forming of a polysilicon gate, according to this invention.
Figure 4B:
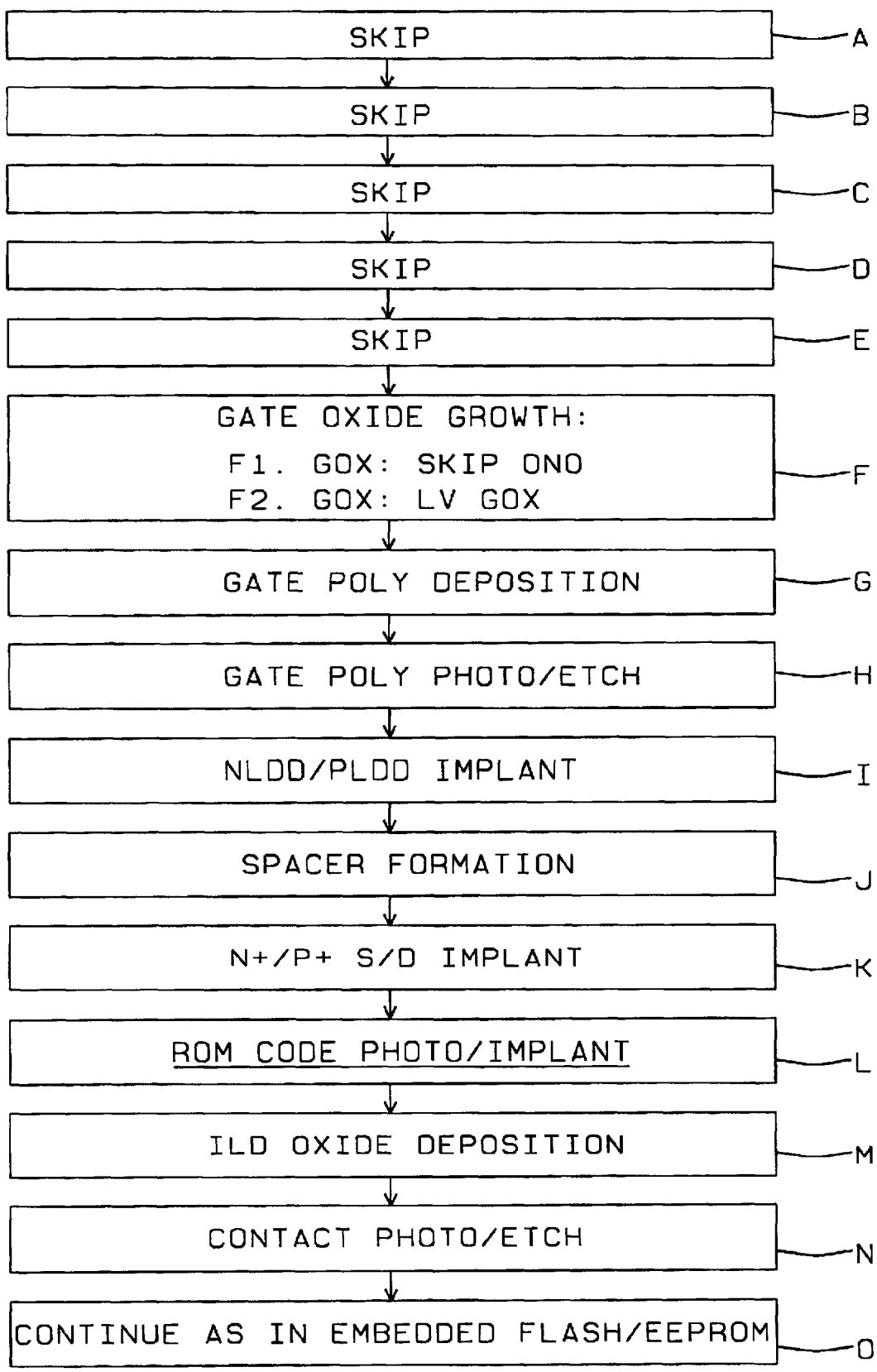

Next, following Step G in FIG. 4b, gate polysilicon layer (250) is formed utilizing the methods used for the embedded flash/EEPROM, and patterned as shown in FIG. 3b, and in Step H of FIG. 4b. The preferred thickness of the second polysilicon layer, namely the polycide layer having silicides as in the embedded flash/EEPROM, is between about 2000 to 3000 Å. After photo-resist patterning (255) as shown in FIG. 3b, and photo-etch of the gate polysilicon layer as shown in FIG. 3c, and indicated in step H of FIG. 4b, the substrate is subjected to a lightly doped drain (LDD) implant, again, using well known techniques, as indicated in Step I of FIG. 4b.

Figure 3D:
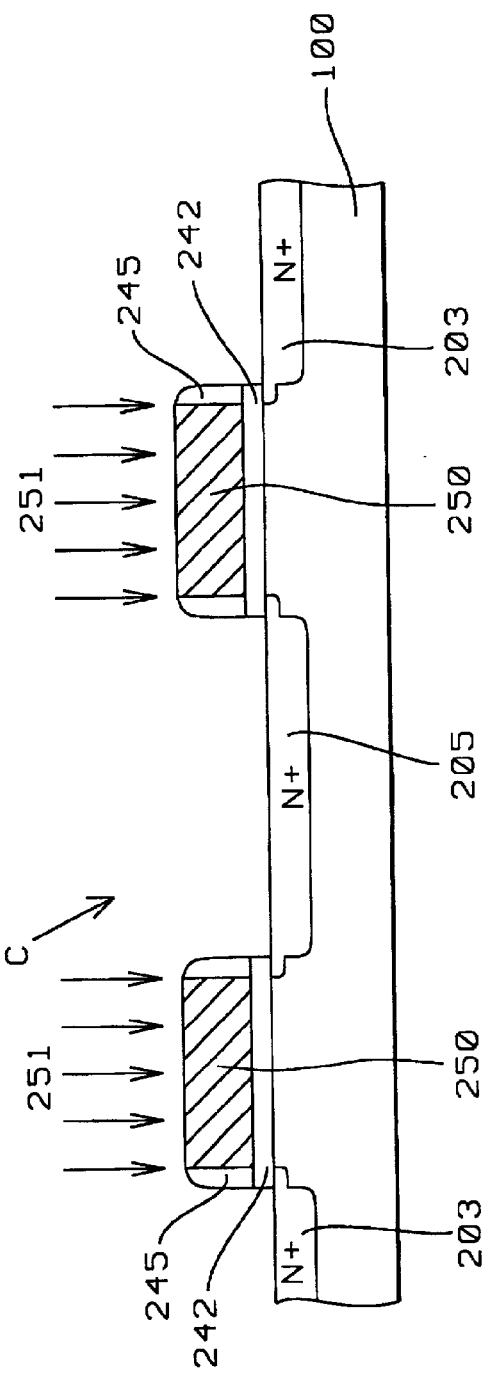
FIG. 3d is a partial cross-sectional view of a ROM semiconductor substrate showing the ROM code implant, according to this invention.
Figure 3E:
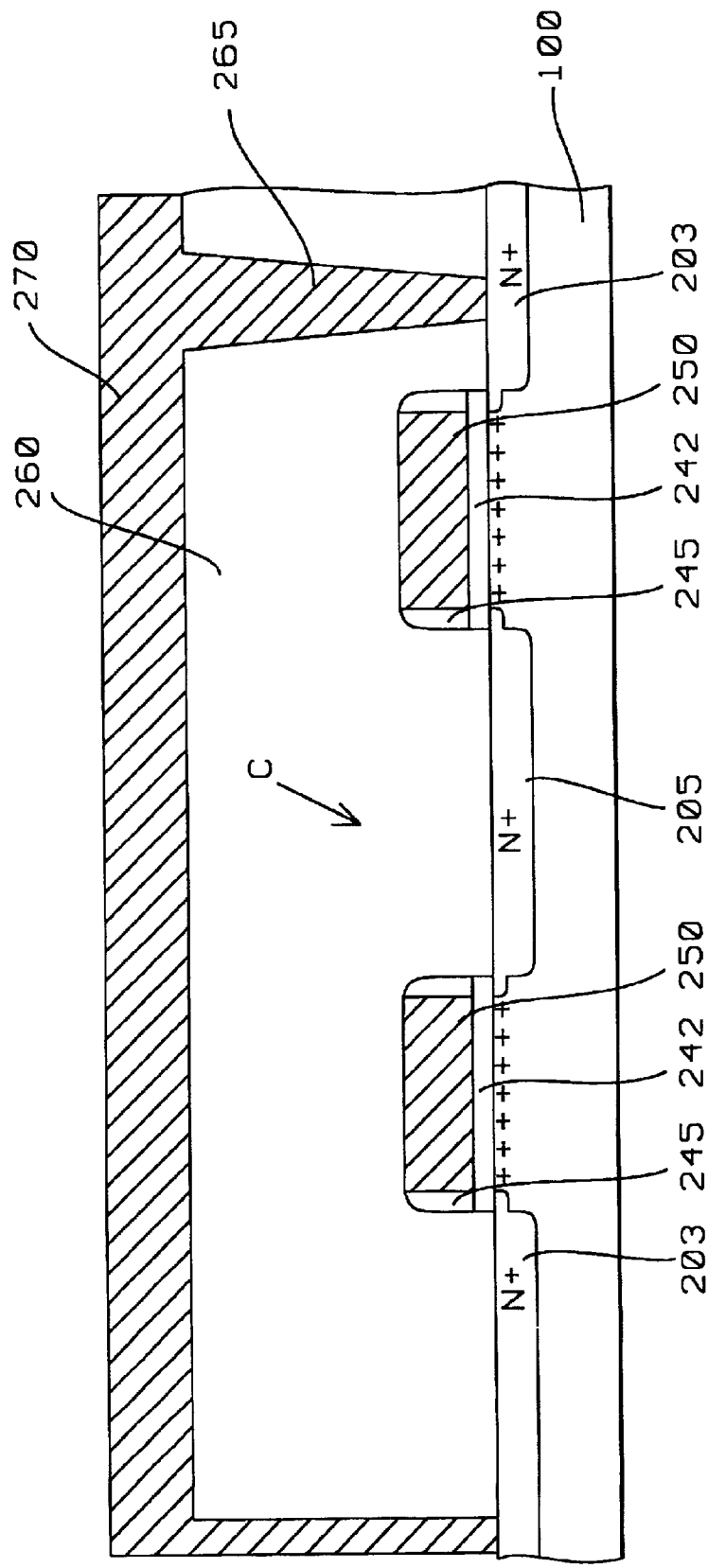
FIG. 3e is a partial cross-sectional view of a semiconductor substrate showing the completion of the cell region of the ROM product of the present invention.
Figure 3F:
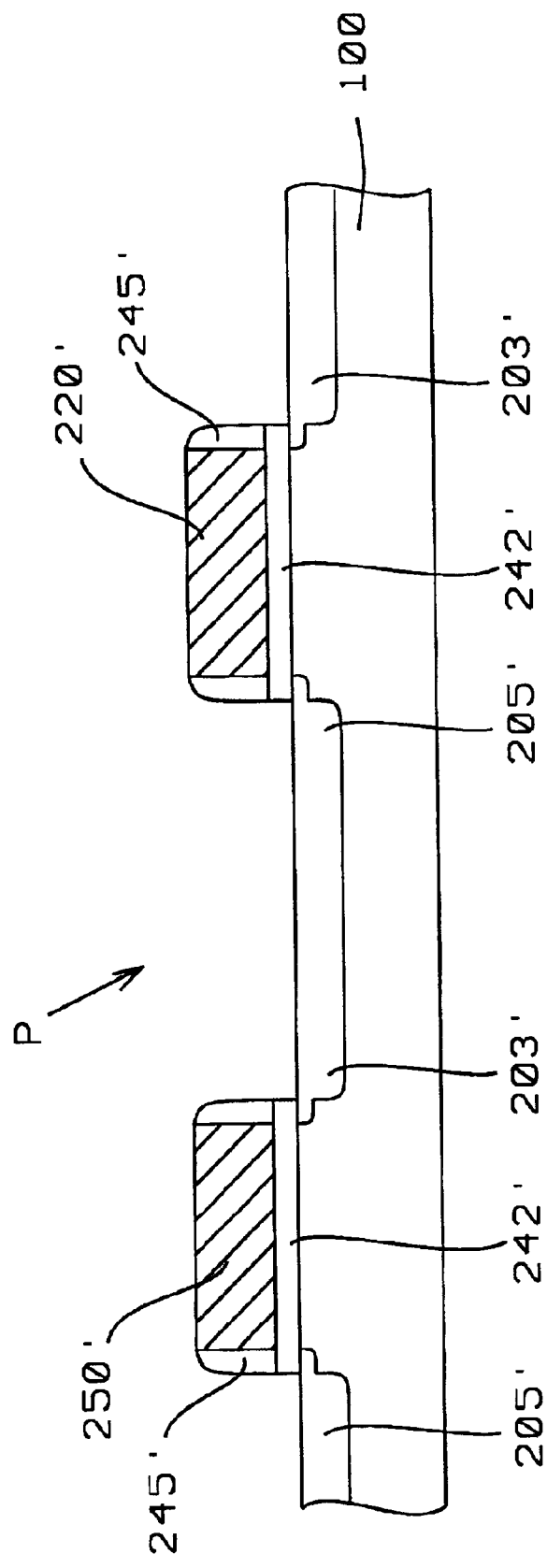
FIG. 3f is a partial cross-sectional view of a semiconductor substrate showing the completion of the periphery region of the ROM product of the present invention.

At the next Step J of FIG. 4b, oxide/SiN spacer s (245) are formed along the vertical sides of the gate layer, as shown in the cell region in FIG. 3d. Spacers (245) in the cell region, and t hose that are in the periphery region, namely, (245') are also seen in FIGS. 3e, and 3f, which show the respective regions. The preferred thickness of the oxide/SiN spacers is between about 800 to 2000 Å. Using the self-aligned spacers, source and drain regions (203), (205) and (203'), (205') are formed by ion implanting with the same conditions used in embedded flash/or EEPROM, namely, with arsenic(A)/phosphorus (P) ions for N-MOS devices, or with boron (B)/boron fluoride ($BF_2$) ions for P-MOS devices, at a dosage level between about $1\times10^5$ to $5\times10^{15}$ atoms/cm$^2$ and energy level between about 20 to 50 KeV.

At the next important and key step of the present invention, ROM code, as determined from the previous embedded flash/EEPROM prototype, is implanted in the cell region C, as shown in FIG. 3d. The underlined Step L of FIG. 4b is accomplished with boron ions at a dosage level between about $1\times10^6$ to $3\times10^6$ atoms/cm$^2$ and energy level between about 100 to 200 KeV. It will be appreciated by those skilled in the art that the only extra Step L required to mask (not shown) regions other than the cell area in order to implant the ROM code is mitigated to a large extent by the elimination of many steps, namely, Steps A–E and Step F1. Thus, the conventional method of forming ROM parts have been reduced by six steps.

The remaining Steps M and N of FIG. 4b follow exactly that of Steps L and M of FIG. 4a. That is, dielectric layer (260) is formed and etched to form a contact holes both in the cell region (C) and the peripheral region (P). The substrate is then metallized by depositing metal (270) as shown in FIG. 3e. The metal may be aluminum or copper, and the preferred thickness is between about 4000 to 6000 Å, which is the same as that used in embedded flash/or EEPROM.

FIGS. 5a–5c also show a method of doing business directed to providing ROM products to a customer. In FIG. 5a, customer product (1') is shown where the Flash or EEPROM product contains logic area (3') and where the flash (5') can be external or embedded. The flash has high voltage (HV) devices and the thick gate oxide as well charge pumps to accommodate the operating high voltage. When ROM products are desired, the customer, usually having little expertise in memory design, will have to exert considerable design effort, or obtain a license to convert the flash product to a ROM product. This can be very time consuming and very costly.

It is disclosed in FIG. 5a and in the accompanying Flow Chart shown in FIG. 5c how to implement the process of manufacturing ROM products by a simple change in the design of a flash or EEPROM product not requiring much effort. First a manufacturing process is provided to manufacture an embedded Flash or embedded EEPROM products Next, a second manufacturing process, similar to the first, is provided for manufacturing an embedded ROM product. The two manufacturing processes differ from each other in that since the ROM product does need neither HV transistors nor a floating gate, the second process has neither the thick-oxide process step, nor the first polysilicon (poly-1) process step. Hence, in the design of the ROM product, HV transistors are eliminated. Also, being only a Read Only Memory, the ROM design is also disabled of the Read and Erase functions. With these minimal changes and without much effort and difficulty, a customer, therefore, is able to convert a Flash or embedded EEPROM product in FIG. 5a into a ROM product depicted in FIG. 5b.

A method of doing business as directed to providing ROM products to a customer is shown in the Flow Chart of FIG. 5c. With the first manufacturing process as stated above, an embedded Flash or EEPROM product is manufactured for the customer, step (a). The customer uses the EEPROM product for prototyping to develop a software program, until a final level of the software program code is established, step (b). Using the ROM design (step(c)) described above, a ROM product is manufactured using the second manufacturing process (step (d)), also stated above, followed by coding the ROM product (step (e)) with the final level of the software program developed as described before. The coding of the product is accomplished through ion implanting using a ROM mask.

Though these numerous details of the disclosed methods are set forth here, such as process parameters and business methods, to provide an understanding of the present invention, it will be obvious, however, to those skilled in the art that these specific details need not be employed to practice the present invention. Thus, the disclosed ROM product can be formed through simply a selective use of an embedded flash/EEPROM process providing a ROM product substrate, forming a ROM mask; performing ROM code implant; forming active devices; a metal layer over the devices; and a contact layer over the metal layer. Also, the flash EEPROM cell structure of the disclosed manufacturing process can be other than the split-gate cell structure, e.g., stacked cell structure. Furthermore, in addition to the implant methods disclosed for ROM code information, other methods for ROM code formation can also be employed. The invention can also be extended to other future technologies beyond the cited 0.5 µm, 0.357 µm and 0.25 µm technologies. MM and RF components can be included in the manufacturing of embedded Flash/EEPROM and Embedded ROM products. At the same time, it will be evident that the same methods may be employed in other similar steps that are too many to cite, such as, for example, the customer may redesign own ROM or license from another company. Or, having manufacturing capabilities, a fabricator can also design and manufacture own embedded Flash and EEPROM for prototyping and own embedded ROM product.

That is, while the invention has been particularly shown and described with reference to the preferred embodiments thereof, it will be understood by those skilled in the art that various changes in form and details may be made without departing from the spirit and scope of the invention.

What is claimed is:

1. A method of forming an embedded ROM product through a selective use of an embedded flash/EEPROM process comprising the steps of:

performing programming simulation for a ROM product using said embedded flash/EEPROM;

generating data to form ROM code for said ROM product;

providing an embedded ROM product substrate having a cell region and a periphery region;

forming a ROM mask;

performing ROM code implant;

forming active devices in said substrate;

forming insulator and metal layer over said devices; and forming an insulator and contact layer over said metal layer.

2. The method of claim 1, wherein said programming simulation is accomplished by using an embedded flash/EEPROM product.

3. The method of claim 1, wherein said ROM mask is for threshold voltage implanting said ROM product.

4. A method of forming a ROM product through a selective use of an embedded flash/EEPROM process comprising the steps of:

providing an embedded flash/EEPROM prototype substrate having different well regions;

defining a cell region and a periphery region further comprising a low-voltage LV-region, and a high-voltage HV-region in said substrate;

forming a gate oxide layer on said substrate including over said cell region and said periphery region;

depositing a first polysilicon layer over said gate oxide layer on said substrate;

forming a nitride layer over said first polysilicon layer;

patterning said nitride layer to form openings to expose portions of said polysilicon layer;

oxidizing said portions of said first polysilicon layer to form poly-oxide as caps over said polysilicon layer;

removing said nitride layer to expose other portions of said first polysilicon layer not protected by said caps;

removing said other portions of said first polysilicon layer by using said poly-oxide as a hard-mask to form a floating gate underlying said cap;

forming a first thick interpoly oxide over said substrate, including over said cell region and over said periphery region;

removing said first thick interpoly oxide (IPO) over said periphery LV-region using one photo-mask;

forming a second interpoly low-voltage LV-oxide over said cell region and over said periphery region;

forming a second polysilicon layer over said LV-oxide and said thick interpoly oxide over said substrate, including said cell region and said periphery region;

patterning said second polysilicon layer to form a control gate over said cell region and a poly gate over said a periphery region;

performing a lightly doped drain (LDD) implant over said substrate;

forming oxide/SiN spacers along every exposed polysilicon edge, including sides of said floating gate, control gate and gate poly;

performing source/drain implant;

forming an interlevel dielectric layer (ILD) over said substrate;

planarizing said ILD layer using either etch-back or CMP methods;

forming a contact hole in said ILD layer;

forming metal in said contact hole and continuing to finish said embedded flash/EEPROM memory prototype;

performing programming simulation for a ROM product using said embedded flash/EEPROM prototype;

generating data to form RON code for said ROM product;

providing a ROM product substrate having a cell region and a periphery region;

forming a ROM gate oxide, comprising LV-gate oxide, over said ROM product substrate, including said cell region and said periphery region;

forming a gate polysilicon layer over said ROM gate oxide layer;

patterning said gate polysilicon layer to form a polysilicon gate;

performing an LDD implant over said ROM substrate;

forming oxide/SiN spacers along sides of said polysilicon gate;

performing source/drain implant over said ROM substrate;

forming a ROM mask;

forming ROM code implant, using said ROM mask;

forming an ILD layer over said substrate;

forming a contact hole in said ILD layer; and forming metal in said contact hole to and continuing to complete the said flash ROM product.

5. The method of claim 4, wherein said well regions are N-type and P-type.

6. The method of claim 4, wherein said forming said floating gate oxide layer is accomplished by thermal oxidation at a temperature between about 800 to 1000° C.

7. The method of claim 4, wherein said gate oxide layer has a thickness between about 80 to 120 Å.

8. The method of claim 4, wherein said depositing a first polysilicon layer is accomplished by LPCVD method employing silane $SiH_4$ as a silicon source material at a temperature range between about 550 to 650° C.

9. The method of claim 4, wherein said first polysilicon layer has a thickness between about 1000 to 2000 Å.

10. The method of claim 4, wherein said nitride layer has a thickness between about 800 to 2000 Å.

11. The method of claim 4, wherein said oxidizing said portions of said polysilicon layer to form said poly-oxide caps is accomplished by wet oxidation at a temperature between about 800 to 1000° C.

12. The method of claim 4, wherein said forming a first interpoly oxide layer is accomplished at a temperature between about 700 to 1000° C.

13. The method of claim 4, wherein said first interpoly oxide is ONO and has a thickness between about 150 to 300 Å.

14. The method of claim 4, wherein said forming a second interpoly oxide layer is accomplished by thermal growth at a temperature between about 800 to 1000° C.

15. The method of claim 4, wherein said second interpoly oxide is ONO having a thickness between about 30 to 150 Å.

16. The method of claim 4, wherein said forming said second polysilicon layer is accomplished by LPCVD method employing silane $SiH_4$ as a silicon source material at a temperature range between about 550 to 650° C.

17. The method of claim 4, wherein said second polysilicon layer is silicided to include $WSi_x$, $TiSi_x$, or $Si_x$ to form a polycide layer.

18. The method of claim 17, wherein said polycide layer has a thickness between about 2000 to 3000 Å.

19. The method of claim 4, wherein said ONO spacers have a thickness between about 800 to 2000 Å.

20. The method of claim 4, wherein said performing said source/drain implant is accomplished with ions As/P or $B/BF_2$ at a dosage between about $1\times10^{15}$ to $5\times10^{15}$ atoms/cm$^2$ and at an energy between about 20 to 50 KEV.

21. The method of claim 4, wherein said performing said ROM code implant is accomplished with boron (B) ions at a dosage between about $1\times10^6$ to $3\times10^6$ atoms/cm$^2$ and at an energy between about 100 to 200 KEV.

22. The method of claim 4, wherein said ILD layer has a thickness between about 7000 to 14000 Å.

23. The method of claim 4, wherein said metal is Al or Cu having a thickness between about 4000 to 6000 Å.

24. The method of claim 4, wherein said performing said programming simulation for a ROM product is accomplished by using threshold voltage implant method.

25. The method of claim 4, wherein said ROM gate oxide has a thickness between about 30 to 150 Å.

26. The method of claim 4, wherein said gate polysilicon layer is silicided to have a total thickness between about 2000 to 3000 Å.

27. The method of claim 4, wherein said performing said LDD implant is accomplished as in the embedded flash/EEPROM process.

28. The method of claim 4, wherein said oxide/SiN spacers have a thickness between about 800 to 2000 Å.

29. The method of claim 4, wherein said performing said ROM code implant is accomplished with ions boron at a dosage between about $1\times10^6$ to $3\times10^6$ atoms/cm$^2$ and at an energy between about 100 to 200 KEV.

30. The method of claim 4, wherein said forming said contact hole is accomplished by etching said ILD with a recipe comprising $CF_4$.

31. The method of claim 4, wherein said metal is Al or Cu having a thickness between about 4000 to 6000 Å.

* * * * *